US005470421A

United States Patent [19]
Nakada et al.

[11] Patent Number: 5,470,421
[45] Date of Patent: Nov. 28, 1995

[54] METHOD FOR PURIFICATION OF ETCHING SOLUTION

[75] Inventors: Akira Nakada, Yotsukaido; Akira Yoneya, Narashino; Noriyuki Kobayashi, Sodegaura; Mamoru Katayanagi, Asaka; Tsutomu Kawashima, Koto; Hiroshi Yoshida, Iwatsuki, all of Japan

[73] Assignee: Nisso Engineering Co., Ltd., Tokyo, Japan

[21] Appl. No.: 305,334

[22] Filed: Sep. 15, 1994

[30] Foreign Application Priority Data

Sep. 17, 1993 [JP] Japan .................................. 5-253672

[51] Int. Cl.⁶ .................................................... H01L 21/306
[52] U.S. Cl. ...................... 156/642.1; 210/750; 210/753; 210/765; 210/766
[58] Field of Search .................. 156/642.1; 252/79.3; 210/750, 753, 765, 766

[56] References Cited

U.S. PATENT DOCUMENTS 3,266,963  8/1966  Stearns ........................ 156/642

3,859,222  1/1975  Squillace et al. .................. 252/79.3
4,230,522  10/1980  Martin et al. ..................... 252/79.3
4,389,281  6/1983  Anantha et al. ................... 252/79.3
4,885,056  12/1989  Hall et al. ........................ 252/79.3
4,971,654  11/1990  Schnegg et al. ................... 156/642
4,980,017  12/1990  Kaji et al. .

FOREIGN PATENT DOCUMENTS 58-55083  4/1983  Japan ............................. 210/753
4-7832    1/1992  Japan .
4366196   12/1992  Japan ............................ 252/79.3

Primary Examiner—Peter A. Hruskoci
Assistant Examiner—Theodore M. Green
Attorney, Agent, or Firm—Oblon, Spivak, McClelland, Maier & Neustadt

[57] ABSTRACT

A method for purifying an etching solution consisting of an aqueous phosphoric acid solution which has been used in etching of a silicon nitride film. In the process, hydrogen fluoride is added to an etching solution consisting of an aqueous phosphoric acid solution which has been used for etching of a silicon nitride film, and the resulting solution is heated to remove fluorides of silicon as reaction products of hydrogen fluoride with silicon compounds which have been contained in the etching solution together with vaporized water.

9 Claims, 1 Drawing Sheet

METHOD FOR PURIFICATION OF ETCHING SOLUTION

BACKGROUND OF THE INVENTION

1. Field of the Invention

The present invention relates to a method for purifying an etching solution consisting of an aqueous phosphoric acid solution which has been used for etching of a silicon nitride film formed on a semiconductor wafer. In particular, it relates to a method for removing a silicon compound contained as an etching reaction product in an etching solution.

2. Discussion of Background

In a wet etching process for manufacturing semiconductor devices, etching is generally conducted while filtering an etching solution to remove impurities such as contaminative particles in the etching solution and recirculating the filtered etching solution so as to maintain the etching solution clean. When reaction products resulting from etching accumulatively increase in the etching solution to precipitate, the precipitates are also removed in the filtration process. In this filtration process, precipitation of reaction products resulting from etching may be urged by means of cooling or the like to effect filtration.

Also in etching of a silicon nitride film with a heated aqueous phosphoric acid solution, as in the above process, a method for filtering and recirculating an etching solution has been known (see U.S. Pat. No. 4,980,017). When silicon compounds as reaction products resulting from etching precipitate in the etching solution, the precipitates may be filtered off together with other impurities to purify the etching solution. However, precipitated silicon compounds cause degradation of an object to be etched. Accordingly, when the concentration of the reaction products resulting from etching in the etching solution becomes high, the etching solution is generally replaced to prevent a semiconductor wafer from being adversely affected by the precipitates.

As mentioned above, in customary etching methods, an etching solution is required to be replaced periodically. Such repeated replacements are bothersome and economically disadvantageous because of the use of the chemical agent in an increased amount. In the methods comprising removal of precipitated reaction products resulting from etching by filtration, a filter is required to be washed periodically to prevent clogging of the filter, thereby hindering efficient operation of an etching plant. In the process for etching a silicon nitride film with a heated aqueous phosphoric acid solution, the etching solution is particularly corrosive and also has a high temperature, thereby leading to troublesome cleaning operation of a filter.

In LOCOS method or the like which is used for the production of an MOS type LSI, selective etching of a silicon nitride film between silicon dioxide film/silicon nitride film is carried out. In the etching, the selection ratio therebetween depends upon the concentration of a silicon compound(s) dissolved in the etching solution as a reaction product(s) resulting from the etching as well as upon the concentration of phosphoric acid.

Variation in the selection ratio due to the change of the concentration of phosphoric acid can substantially be prevented by conducting etching while adding water in an amount corresponding to the amount of water evaporating out of an etching bath. However, variation in the selection ratio due to change in the concentration of the dissolved silicone compound(s) cannot be avoided unless the etching solution is frequently replaced.

SUMMARY OF THE INVENTION

It is, therefore, an object of the present invention to provide a process for purifying an etching solution which is capable of overcoming the above-mentioned drawbacks inherent in the conventional techniques in etching of a silicon nitride film with an aqueous phosphoric acid solution as an etching solution, and which enables the removal of etching reaction products from the etching solution to be readily effected.

It is another object of the present invention to provide a process for purifying an etching solution which enables a prolonged working life of an etching solution and efficient operation of an etching plant.

To attain the above-mentioned objects, there is provided a method of the present invention for purifying an etching solution consisting of an aqueous phosphoric acid solution which has been used for etching of a silicon nitride film formed on a semiconductor wafer and contains silicon compounds resulting from the etching, said method comprising:

adding hydrogen fluoride to an etching solution, said etching solution consisting of an aqueous phosphoric acid solution which has been used for etching of a silicon nitride film formed on a semiconductor water and contains silicon compounds resulting from the etching, and heating the resulting solution to remove fluorides of silicon as reaction products of the silicon compounds with hydrogen fluoride, together with vaporized water.

The above and other objects of the present invention will readily be understood by the following description.

DETAILED DESCRIPTION OF THE INVENTION

Figure 1:
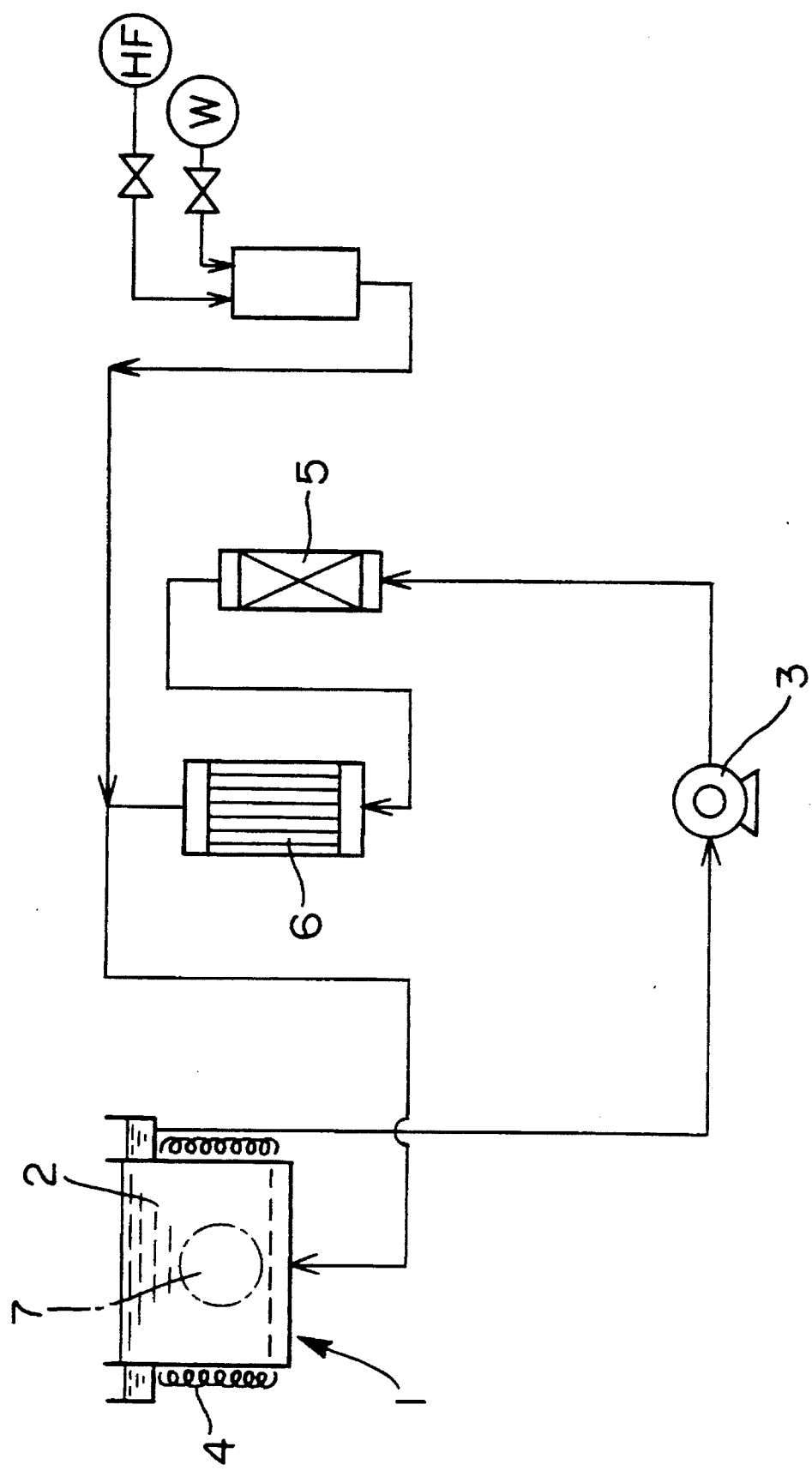
FIG. 1 is a diagrammatic view illustrating one mode of the addition of hydrogen fluoride as one of the operative steps of the present invention while conducting etching treatment.

When a silicon nitride film is etched with an aqueous phosphoric acid solution, etching-derived silicon forms silicon compounds in the etching solution. In the present invention, the silicon compounds are reacted with added hydrogen fluoride to form fluorides of silicon, and the fluorides are removed from the etching solution by heating. It is as yet impossible to strictly specify the mechanism of the reaction caused by the addition of hydrogen fluoride to the etching solution. It is, however, believed that the silicon compound is converted into silicon tetrafluoride, and further into fluorosilicic acid in accordance with the following reaction formulae:

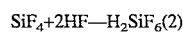

wherein the silicon compounds are represented by "—Si—".

From a heated etching solution is evaporated water to cause the silicon tetrafluoride, the fluorosilicic acid and unreacted hydrogen fluoride to be entrained with the vaporized water and thereby to be removed from the etching solution.

When the silicon compounds as reaction products resulting from the etching precipitate to cause clogging of a filter, the precipitates are removed in the same manner as above.

In the present invention, hydrogen fluoride may be added in the form of hydrogen fluoride gas or in the form of hydrofluoric acid.

For efficient removal of the fluorides of silicon formed in accordance with the above-mentioned reaction formulae (1) and (2), and unreacted hydrogen fluoride, it is preferred to evaporate water in a large amount. For this purpose, in general, water or water vapor is added to the etching solution, and heating required for vaporizing water from the resulting solution is conducted.

Instead of increasing the amount of vaporing water, an inert gas such as nitrogen gas may be blown into the etching solution to enhance efficiency in removal of the fluorides of silicon and unreacted hydrogen fluoride.

When the etching solution is heated at a temperature lower than its boiling point, the above-mentioned introduction of an inert gas is essential.

The purification of an etching solution according to the present invention may be conducted in parallel with the etching of a silicon nitride film with a high-temperature aqueous phosphoric acid solution, or may be conducted subsequently to withdrawal of an etched product such as a semiconductor wafer from an etching bath after completion of the etching.

The above methods have the following advantages, respectively. Accordingly, preferred one is appropriately selected therefrom depending upon various conditions such as an object to be etched and operation conditions.

Although the latter method is not capable of providing optimized working efficiency of the etching plant, it has advantage that since hydrogen fluoride is added to an etching solution in the absence of a semiconductor wafer as an object to be etched, the concentration of hydrogen fluoride in the etching solution and the heating temperature and the like are not required to be strictly controlled.

On the other hand, although the former method has such a phase that since hydrogen fluoride is added to the etching solution in the presence of an object to be etched, the concentration of hydrogen fluoride in the etching solution, the rate of the addition, the heating time and the like are sometimes obliged to be set within restricted ranges, it has advantage that satisfactorily enhanced working efficiency of an etching plant can be attained. In particular, the method of the present invention is suitable for the selective etching of a silicon nitride film in the production of MOS type LSI wherein the selection ratio between silicon nitride and silicon dioxide films is required to be precisely controlled. In other words, to keep the selection ratio between the films constant, etching is conducted while supplying water to keep concentration of the aqueous phosphoric acid solution. The supplied water preferably serves as the added water in the present invention, and the silicon compounds in the etching solution are continuously removed out of the system. Accordingly, the change in the concentration of the silicon compounds can be diminished, thereby providing effect that the selection ratio in etching is effectively kept constant.

The mode for adding hydrogen fluoride in parallel with etching of a silicon nitride film is not restricted to the method which comprises adding hydrogen fluoride directly into an etching bath. The mode also includes a method which comprises drawing out a portion of an etching solution 2 contained in an etching bath 1 by means of a pump 3 or the like, and adding hydrogen fluoride HF and water W to the drawn etching solution, and forcing the resulting solution to circulate into the etching bath, as shown in FIG. 1. In this FIG., reference number 4 represents a main heater for heating the etching solution 2 in the etching bath 1, reference number 5 represents a filter, reference number 6 represents a sub-heater for heating a circulated etching solution, and reference number 7 represents a semiconductor wafer as an object to be etched.

Hydrogen fluoride is added in an amount of 6 mol or more per mol of the silicon content (in terms of silicon dioxide). The whole amount of hydrogen fluoride may be added at one time. It is, however, preferred to add hydrogen fluoride continuously or intermittently to maintain the concentration of hydrogen fluoride (HF concentration) in the etching solution at not too high a level. In particular, when the method according to the present invention is carried out in parallel with etching operation, it is preferred to add hydrogen fluoride continuously or intermittently in an amount (within the above-mentioned range) corresponding to the formation ratio of the silicon content in the etching solution. The amount of 6 mol is a theoretical amount in accordance with the above-mentioned reaction formulae. Actually, unreacted hydrogen fluoride tends to be distilled out of the system, and accordingly, an excess amount of hydrogen fluoride is generally added.

The optimum amount of hydrogen fluoride may be appropriately determined depending upon various conditions such as configuration of a device, heating temperature of an etching solution, quantity of heat applied, amount of water evaporated, concentration of remaining silicon content and concentration of hydrogen fluoride which are acceptable or intended in an etching solution. According to the results of various experiments, the optimum amount of hydrogen fluoride is generally in the range of 10 mol to 50 mol per mol of the silicon content (in terms of silicon dioxide). Even if the amount is more than 50 mol, no substantial problem is caused with respect to the removal of the silicon content. Such an amount causes industrially disadvantageous problems, however, that it takes a long period of time to remove the excess hydrogen fluoride, and a device likely to be corroded.

The amount of water to be evaporated is more than a thousand times by weight, preferably more than ten thousand times the amount of the silicon content (in terms of Si) to be removed. The optimum amount thereof may appropriately be determined depending upon configuration of a device, the amount, of the excess hydrogen fluoride, and the like. Water may be added in the form of hydrofluoric acid, or in the form of liquid water or water vapor. When water is present in an amount corresponding to the above-mentioned one in an etching solution to be purified, water is not necessarily required to be added. By evaporating the above-mentioned amount of water, the intended removal of the silicon content is achieved, and yet, the unreacted excess hydrogen fluoride is removed to a level of concentration which does not adversely affect etching performance.

When the process of the present invention is carried out in parallel with etching operation, water is continuously or intermittently added in the above-mentioned amount corresponding to the amount of the silicon content formed in the etching solution.

The addition of hydrogen fluoride and the addition of water may be conducted either in the etching bath or in the filtering and circulating path outside the bath.

In the present invention, the method which comprises blowing an inert gas such as nitrogen gas into an etching solution to cause a silicon content to be entrained with the inert gas, thereby promoting removal of the silicon content out of the system, enables enhanced removing efficiency to be realized.

The removal of the fluorides of silicon attendant upon the evaporation of water is generally conducted in the etching bath. However, the removal may be conducted in a removing means such as an evaporation bath which is separately formed in the circulating path.

The heating for removing the fluorides of silicon together with the evaporated water is generally conducted in such a manner that the etching solution is maintained in a boiling condition. However, the heating may be conducted at a temperature lower than the boiling point of the etching solution. In this case, the above-mentioned introduction of the inert gas is required so as to compensate for shortage of the evaporated water.

The amount of the inert gas to be introduced is set in such an amount that total of gas volumes of the evaporated water and the inert gas is a gas volume corresponding to the above-mentioned required amount of water to be evaporated.

When the purification of the etching solution is carried out in parallel with the etching treatment, the etching solution is heated so as to keep the concentration of phosphoric acid constant in the etching solution while adding water.

As described above, the process for purifying an etching solution according to the present invention has the following effects.

(1) In etching of a silicon nitride film with an aqueous phosphoric acid solution, silicon compounds as reaction products resulting from the etching which accumulatively increase in the etching solution can readily be removed from the system, so that an extremely prolonged life of the etching solution can be attained.

(2) Even if a filter placed in a circulating path of an etching solution is clogged with precipitated silicon compounds, it is not necessarily required to perform cumbersome removal, replacement, washing of the filter and the like. Consequently, it is achieved that less frequency of replacement or washing of the filter is required.

(3) In selective etching of a silicon nitride film in silicon dioxide film/silicon nitride film, when the present invention is applied thereto, concentration of silicon compounds in an etching solution which affects the selectivity can appropriately be controlled.

(4) By purifying an etching solution in parallel with etching treatment, satisfactorily enhanced working efficiency of an etching plant can be attained.

(5) By adding hydrogen fluoride to an etching solution in the absence of an object to be etched (for example, a semiconductor wafer), concentration of hydrogen fluoride in the etching solution, the heating temperature and the like are not required to be strictly controlled.

EXAMPLES

Hereinbelow, the present invention will be described more in detail with reference to Examples.

In the following Examples, concentration of silicon compounds and concentration of hydrogen fluoride are given in mg/l(20° C.) in terms of Si and fluorine ion, respectively. The concentration of Si and the concentration of F anion were measured by means of an atomic-absorption flame spectrophotometer and an ion densitometer, respectively.

EXAMPLE 1

To 200 g of an 85% aqueous phosphoric acid solution containing 130 mg/l of Si which has been used in etching of a silicon nitride film was added 15 g of a 1% hydrofluoric acid, and the resulting solution was heated at a temperature of 150° to 160° C. for 1 hour while being stirred. The solution was cooled to room temperature, and the amount of the solution was measured and found to be 173 g. 27 g of pure water was added thereto, and then Si concentration was measured (48 m/l).

EXAMPLE 2

To 200 g of an 85% aqueous phosphoric acid solution containing 110 m/l of Si which has been used in etching of a silicon nitride film was added 15 g of a 0.5% hydrofluoric acid, and the resulting solution was heated at a temperature of 145° to 155° C. for 1 hour while introducing water vapor thereinto. The solution was cooled to room temperature, and the amount of the solution was measured and found to be 199 g. In this solution, Si concentration was 45 mg/l and F anion concentration was 19 mg/l. Incidentally, the amount of the introduced water vapor was 105 g.

EXAMPLE 3

Using an etching device equipped with a device for recirculating and filtering an etching solution (Model NISON 1800 manufactured by Nisso Engineering Company, Ltd.: imparted with heating, pure water supplying, and filtering functions), etching of a silicon nitride film (on a Si substrate of 6 inch-diameter, a silicon dioxide film of about 1,000 A in thickness and a silicon nitride film of 1,500 A in thickness are formed) was conducted with 56kg of an 85% aqueous phosphoric acid solution at a high temperature of 160° C. Upon arrival of Si concentration at 100 m/l, etching was continued for 10 batches in total while adding 0.2 kg of a 5% hydrofluoric acid per each batch (in which 50 pieces of the above-mentioned wafers were treated). Then, Si concentration in the resulting etching solution was measured and found to be 105 mg/l.

During the treatment, pure water was supplied in an amount corresponding to the amount of water evaporated from the etching bath by means of the recirculating and filtering device to keep the concentration of phosphoric acid constant. The amount of the supplied water was about 6 kg/batch.

COMPARATIVE EXAMPLE

Etching treatment of a silicon nitride film was conducted in the same manner as in Example 3, except that no hydrofluoric acid was added. Si concentration of the resulting etching solution was 124 mg/l, and silicon compounds were deposited on the filter in a large amount.

What is claimed is:

1. A method for purifying an etching solution consisting of an aqueous phosphoric acid solution which has been used for etching of a silicon nitride film formed on a semiconductor wafer and contains silicon compounds resulting from the etching, said method comprising:

adding hydrogen fluoride in an amount of 6 moles or more per mole of said silicon compounds, in terms of silicon dioxide, and, if necessary, additional water, to an etching solution, said etching solution consisting of an aqueous phosphoric acid solution which has been used for etching of a silicon nitride film formed on a semiconductor wafer and contains silicon compounds resulting from the etching, and heating the resulting solution to evaporate water in an amount more than a thousand times of the weight of silicon content to be removed and to remove fluorides of silicon as reaction products of the silicon compounds with hydrogen fluoride together with vaporized water.

2. The method for purifying an etching solution according to claim 1, wherein an inert gas is blown into said etching solution to cause said fluorides of silicon to be entrained with said inert gas, thereby promoting removal of said fluorides of silicon.

3. The method for purifying an etching solution according to claim 1 or 2, wherein said etching solution is heated to its boiling point.

4. The method for purifying an etching solution according to claim 2, wherein said etching solution is heated to a temperature lower than its boiling point.

5. The method for purifying an etching solution according to claim 1 or 2, wherein hydrogen fluoride is added to said etching solution subsequently to withdrawal of the semiconductor wafer from said etching solution.

6. The method for purifying an etching solution according to claim 1 or 2, wherein hydrogen fluoride is added to said etching solution while conducting etching of said silicon nitride film.

7. The method for purifying an etching solution according to claim 6, wherein a portion of said etching solution is drawn out of an etching bath, and hydrogen fluoride is added to the drawn etching solution, and the resulting solution is forced to circulate into said etching bath.

8. The method according to claim 1, wherein hydrogen fluoride is added in an amount of 10 to 50 moles per mole of silicon compounds, in terms of silicon dioxide.

9. The method according to claim 1, wherein water is evaporated in an amount more than ten thousand times the weight of silicon content to be removed.

* * * * *